(12) United States Patent
Liu et al.

(10) Patent No.: US 11,626,480 B2
(45) Date of Patent: Apr. 11, 2023

(54) METHOD FOR MANUFACTURING A SEMICONDUCTOR SUPER-JUNCTION DEVICE

(71) Applicant: SUZHOU ORIENTAL SEMICONDUCTOR CO., LTD., Jiangsu (CN)

(72) Inventors: Wei Liu, Jiangsu (CN); Yuanlin Yuan, Jiangsu (CN); Zhenyi Xu, Jiangsu (CN); Yi Gong, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 17/440,078

(22) PCT Filed: Sep. 22, 2020

(86) PCT No.: PCT/CN2020/116682
§ 371 (c)(1),
(2) Date: Sep. 16, 2021

(87) PCT Pub. No.: WO2021/223353
PCT Pub. Date: Nov. 11, 2021

(65) Prior Publication Data
US 2023/0052416 A1 Feb. 16, 2023

(30) Foreign Application Priority Data
May 6, 2020 (CN) .......................... 202010372056.5

(51) Int. Cl.
*H01L 21/3065* (2006.01)
*H01L 29/06* (2006.01)
*H01L 21/02* (2006.01)
*H01L 21/265* (2006.01)
*H01L 21/306* (2006.01)
*H01L 21/308* (2006.01)

(52) U.S. Cl.
CPC .... *H01L 29/0634* (2013.01); *H01L 21/02532* (2013.01); *H01L 21/02579* (2013.01); *H01L 21/26513* (2013.01); *H01L 21/3081* (2013.01); *H01L 21/30604* (2013.01)

(58) Field of Classification Search
None
See application file for complete search history.

(56) References Cited

U.S. PATENT DOCUMENTS

| | | | |
|---|---|---|---|
| 5,998,836 A | 12/1999 | Williams | |
| 2015/0076594 A1* | 3/2015 | Hsieh | H01L 29/7811 257/334 |

FOREIGN PATENT DOCUMENTS

| | | |
|---|---|---|
| CN | 108767000 A | 11/2018 |
| CN | 109830532 A | 5/2019 |

(Continued)

OTHER PUBLICATIONS

PCT/CN2020/116682 International Search Report dated Jan. 20, 2021.

*Primary Examiner* — Jack S Chen
(74) *Attorney, Agent, or Firm* — Michael Best & Friedrich LLP

(57) ABSTRACT

Disclosed is a method for manufacturing a semiconductor super-junction device. The method includes: a p-type column is formed through an epitaxial process, and then a gate is formed in a self-alignment manner.

9 Claims, 6 Drawing Sheets

(56) References Cited

FOREIGN PATENT DOCUMENTS

DE 102004009323 A1 9/2005
WO 2020084736 A1 4/2020

* cited by examiner

US 11,626,480 B2

METHOD FOR MANUFACTURING A SEMICONDUCTOR SUPER-JUNCTION DEVICE

CROSS-REFERENCE TO RELATED APPLICATIONS

This is a National Stage Application filed under 35 U.S.C. 371 based on International Patent Application No. PCT/CN2020/116682, filed on Sep. 22, 2020, which claims priority to Chinese Patent Application No. 202010372056.5 filed on May 6, 2020, the disclosures of both of which are incorporated herein by reference in their entireties.

TECHNICAL FIELD

The present disclosure relates to the technical field of a semiconductor super-junction device, and for example, to a method for manufacturing a semiconductor super-junction device.

BACKGROUND

A semiconductor super-junction device is based on a charge balance technology, and can reduce an on resistance and a parasitic capacitance, so that the semiconductor super-junction device has an extremely fast switching characteristic, the switching loss can be reduced, and the higher power conversion efficiency is achieved. A main manufacturing process of the semiconductor super-junction device in the related art includes: firstly, as shown in FIG. 1, a hard mask layer 11 is formed on an n-type epitaxial layer 10, then the hard mask layer 11 is photoetched and etched, an opening is formed in the hard mask layer 11 and a trench 12 is formed in the n-type epitaxial layer 10; next, as shown in FIG. 2, a p-type column 13 is formed in the formed trench through an epitaxial process, and the p-type column 13 is performed a planarization processing, then, as shown in FIG. 3, a gate dielectric layer 14 and a gate 15 are formed through a photoetching process and an etching process once again, and finally, a p-type body region 16 and an n-type source region 17 located in the p-type body region 16 are formed in the n-type epitaxial layer 10. In the related art, the photoetching process needs to be performed once when the p-type column is formed and then the photoetching process needs to be performed once again when the gate is formed no matter for a planar-type semiconductor super-junction device or a trench-type semiconductor super-junction device, and due to a fact that the photoetching process is high in cost and has the risk of an alignment deviation, therefore, the manufacturing cost and the manufacturing risk of the semiconductor super-junction device are relatively high.

SUMMARY

The present disclosure provides a method for manufacturing a semiconductor super-junction device so as to reduce the manufacturing cost of the semiconductor super-junction device and reduce the manufacturing risk of the semiconductor super-junction device.

The present disclosure provides a method for manufacturing a semiconductor super-junction device. The method includes following steps.

A hard mask layer is formed on an n-type epitaxial layer, a position of a p-type column is defined through a photoetching process, then the hard mask layer is etched, and at least one opening is formed in the hard mask layer, where the at least one opening corresponds to the position of the p-type column.

The n-type epitaxial layer is etched with the hard mask layer as a mask, and a first trench is formed in the n-type epitaxial layer, where a width of the first trench is larger than a width of an opening corresponding to the first trench, and the first trench includes a p-type column region located below the opening corresponding to the first trench and a gate region located on two sides of the p-type column region.

A sacrificial dielectric layer is formed in the gate region of the first trench.

The n-type epitaxial layer is etched with the hard mask layer and the sacrificial dielectric layer as masks, and a second trench is formed in the n-type epitaxial layer, where the second trench is located below a p-type column region corresponding to the second trench.

The p-type column is formed in the p-type column region and the second trench, and a pn junction structure is formed between the p-type column and the n-type epitaxial layer.

The hard mask layer and the sacrificial dielectric layer are removed, and a gate dielectric layer and a gate are formed in the gate region of the first trench.

In an embodiment, the method for manufacturing a semiconductor super-junction device further includes following steps.

A p-type body region is formed in the n-type epitaxial layer.

An n-type source region is formed in the p-type body region.

In an embodiment, the hard mask layer is a laminated layer of a silicon oxide layer, a silicon nitride layer, and a silicon oxide layer.

In an embodiment, an etching method combining an anisotropic etching and an isotropic etching is adopted when the first trench is formed through an etching.

In an embodiment, the sacrificial dielectric layer is made of a silicon oxide.

In an embodiment, a width of the second trench is greater than a width of a p-type column region corresponding to the second trench.

In an embodiment, an etching method combining an anisotropic etching and an isotropic etching is adopted when the second trench is formed through an etching.

In an embodiment, before the p-type column is formed, a p-type ion implantation once is performed so as to form a p-type compensation region below the second trench or in the n-type epitaxial layer below the second trench and on two sides of the second trench.

In an embodiment, the p-type column is made of a p-type polycrystalline silicon.

According to the method for manufacturing the semiconductor super-junction device provided in the present disclosure, after the p-type column is formed, the gate may be formed in a self-alignment manner, so that only the photoetching process once is needed when the gate and the p-type column are formed, which can greatly reduce the manufacturing cost of the semiconductor super-junction device, and reduce the manufacturing risk of the semiconductor super-junction device.

DETAILED DESCRIPTION

A technical solution of the present disclosure will now be described in a specific manner in conjunction with the accompanying drawings in embodiments of the present disclosure. Terms such as "having," "including," and "includes" as used in the present disclosure do not preclude the presence or addition of one or more other elements, or combinations thereof. Moreover, in order to illustrate specific embodiments of the present disclosure, the schematic drawings are shown exaggerated in thickness of layers and regions of the present disclosure, and the dimensions of the drawings are not representative of actual dimensions.

FIGS. 4 to 11 are schematic cross-sectional structure diagrams of main structures in a manufacturing process of one embodiment of a method for manufacturing a semiconductor super-junction device provided in the present disclosure.

Figure 1:
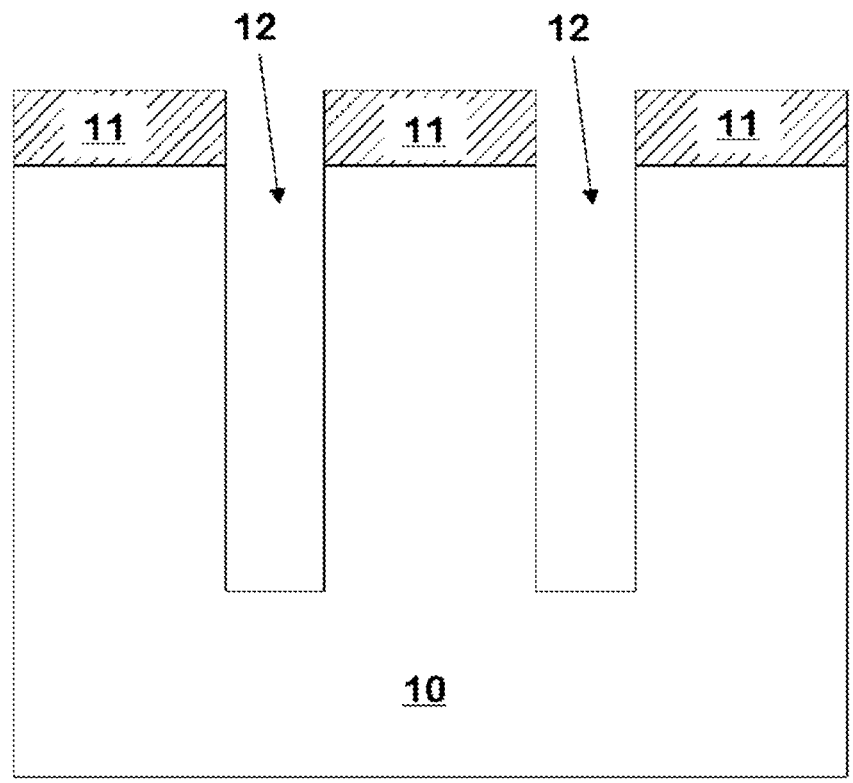
FIGS. 1-3 are schematic cross-sectional structure diagrams of main structures in a manufacturing process of a semiconductor super-junction device in the related art.
Figure 2:
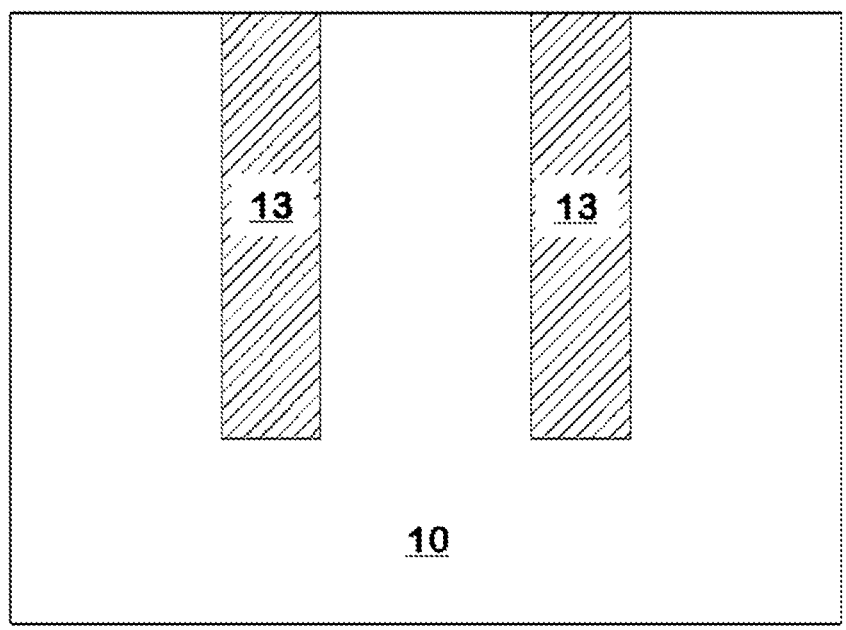
Figure 3:
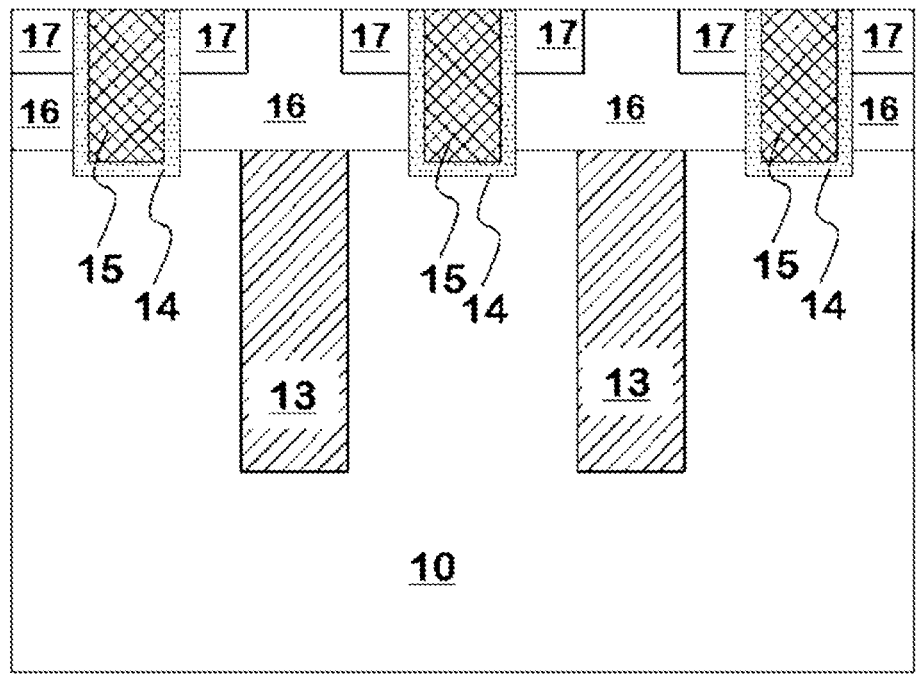
Figure 4:
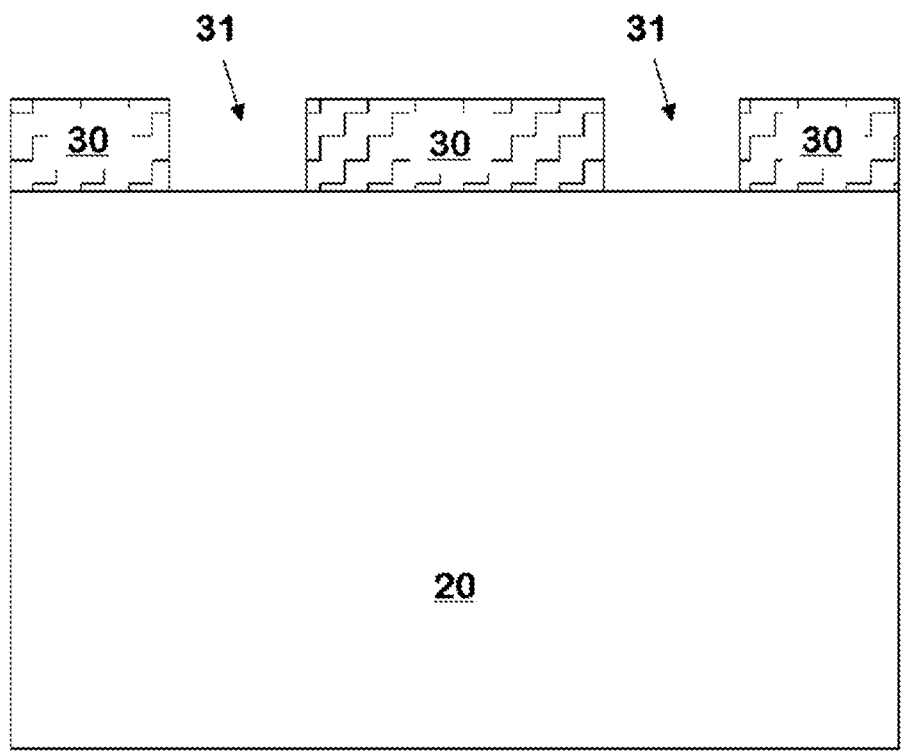
FIGS. 4-11 are schematic cross-sectional structure diagrams of main structures in a manufacturing process of one embodiment of a method for manufacturing a semiconductor super-junction device provided in the present disclosure.

Firstly, as shown in FIG. 4, a hard mask layer 30 is formed on a provided n-type epitaxial layer 20, the n-type epitaxial layer 20 is typically a silicon, and the hard mask layer 30 is typically a laminated layer of a silicon oxide layer, a silicon nitride layer, and a silicon oxide layer. A position of a p-type column is defined through a photoetching process, then the hard mask layer 30 is etched, at least one opening 31 is formed in the hard mask layer 30, and the at least one opening 31 corresponds to the position of the p-type column, and a number of the openings 31 (namely a number of the p-type columns) in the hard mask layer 30 is determined by a specification of the designed semiconductor super-junction device. Two openings 31 are shown in the embodiment of the present disclosure by way of example only.

Figure 5:
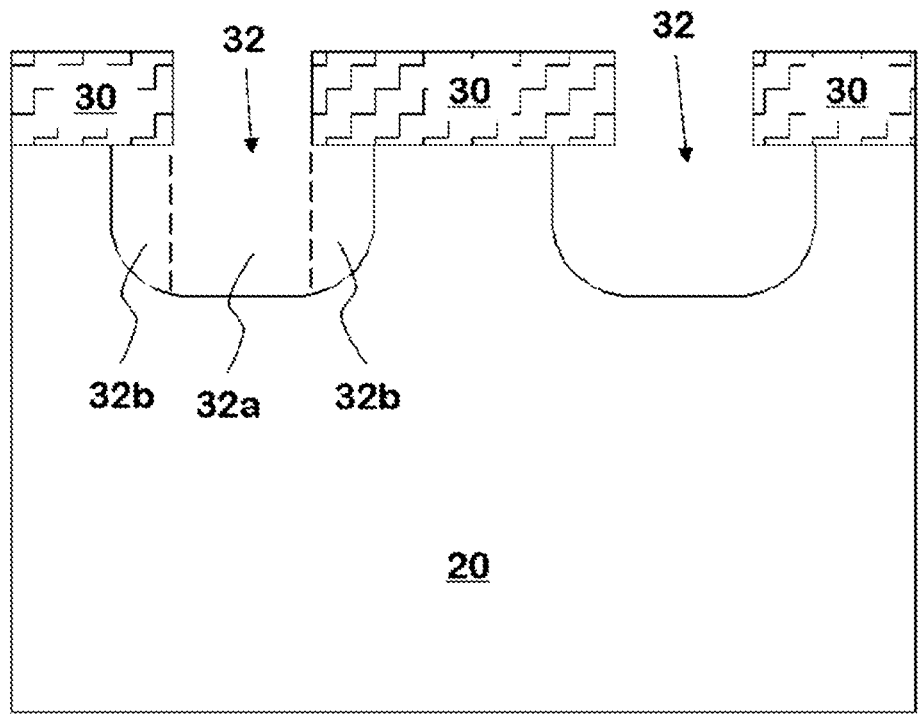

Next, as shown in FIG. 5, the n-type epitaxial layer 20 is etched with the hard mask layer 30 as a mask, a first trench 32 is formed in the n-type epitaxial layer 20, the first trenches 32 are in one-to-one correspondence with the openings in the hard mask layer 30, and the first trench 32 includes a p-type column region 32a located below a corresponding opening and a gate region 32b located on two sides of the p-type column regions 32a. When the first trench 32 is formed through an etching, a method combining an anisotropic etching and an isotropic etching is selected, for example, the p-type column region 32a of the first trench 32 is formed through an anisotropic etching method, and then the gate region 32b of the first trench 32 is formed through an isotropic etching method.

Figure 6:
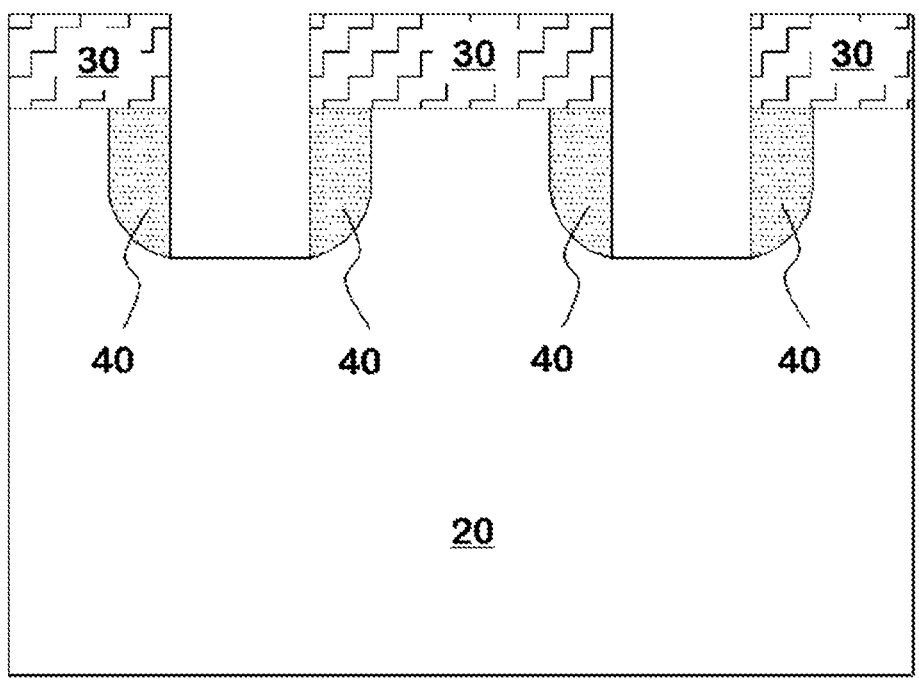

Next, as shown in FIG. 6, a sacrificial dielectric layer 40 is formed in a gate region of the first trench, and the sacrificial dielectric layer 40 is typically a silicon oxide. The method includes following steps: firstly, a layer of silicon oxide is formed through a depositing or oxidizing, and then the deposited silicon oxide is etched back. When the silicon oxide is formed through the depositing, a whole first trench may be filled with the silicon oxide, or the whole first trench may not be filled with the silicon oxide, but the gate region of the first trench is filled with the silicon oxide.

Figure 7:
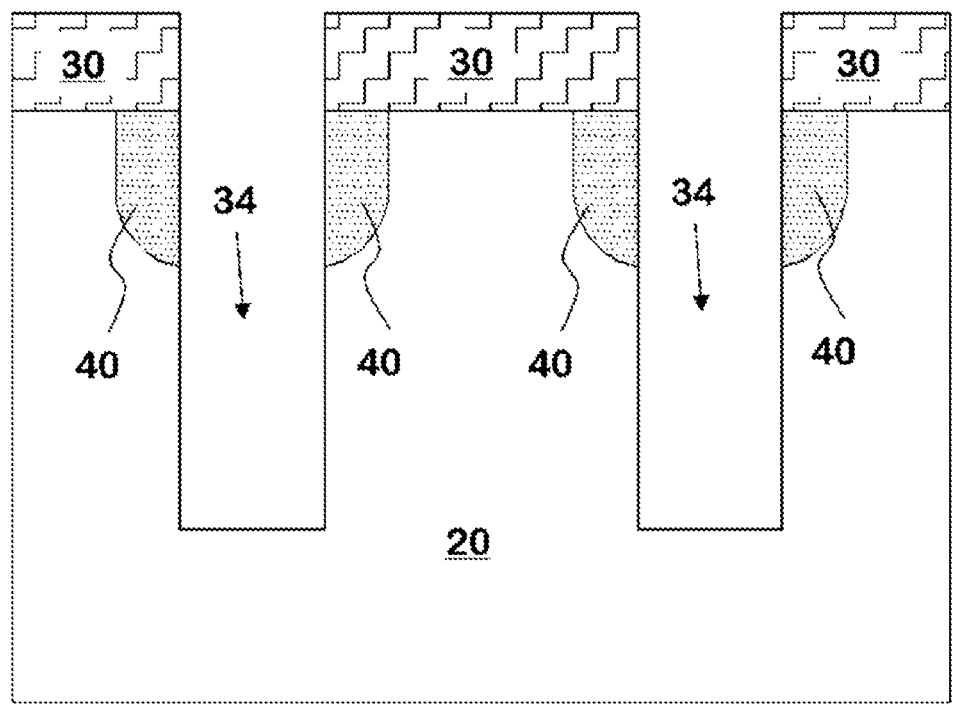
Figure 8:
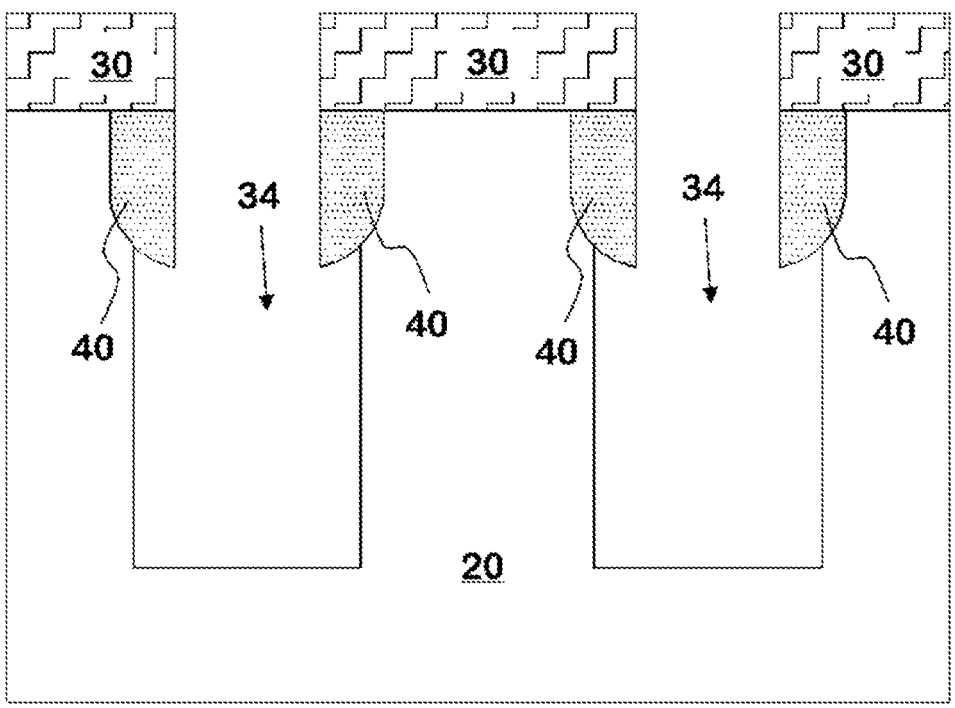

Next, as shown in FIG. 7, the n-type epitaxial layer 20 is etched with the hard mask layer 30 and the sacrificial dielectric layer 40 as masks, and a second trench 34 located below the first trench is formed in the n-type epitaxial layer 20. In an embodiment, as shown in FIG. 8, a width of the second trench 34 may be greater than a width of a corresponding p-type column region, and correspondingly, when the second trench 34 is formed through an etching, an etching method combining an anisotropic etching and an isotropic etching may be adopted, exemplarily, the anisotropic etching method may be adopted firstly to perform the etching, and the isotropic etching method may be adopted secondly to perform the etching, so that the width of the second trench 34 is increased, and thus a width of the n-type epitaxial layer between adjacent second trenches 34 is reduced.

Figure 9:
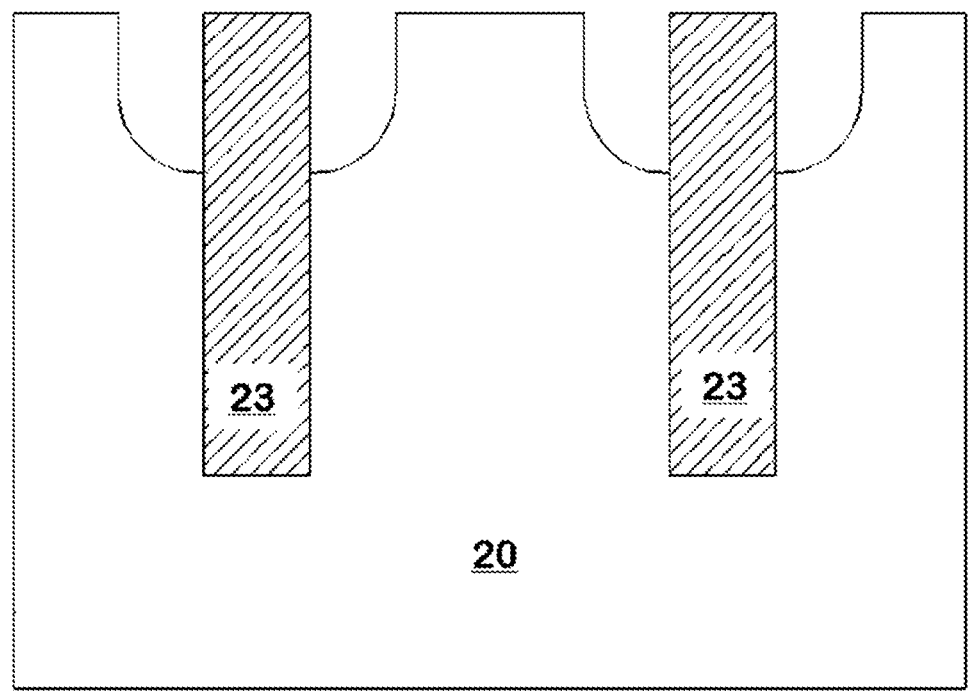

Next, as shown in FIG. 9, a p-type column 23 is formed in the p-type column region and the second trench, and the hard mask layer and the sacrificial dielectric layer are removed. A pn junction structure is formed between the p-type column 23 and the n-type epitaxial layer 20, and the p-type column 23 may be made of a p-type polycrystalline silicon and is typically formed through an epitaxial process. In an embodiment, a p-type ion implantation may be performed once before the p-type column 23 is formed so as to form a p-type compensation region below the second trench or in the n-type epitaxial layer below the second trench and on two sides of the second trench, which achieves a better charge balance effect.

Figure 10:
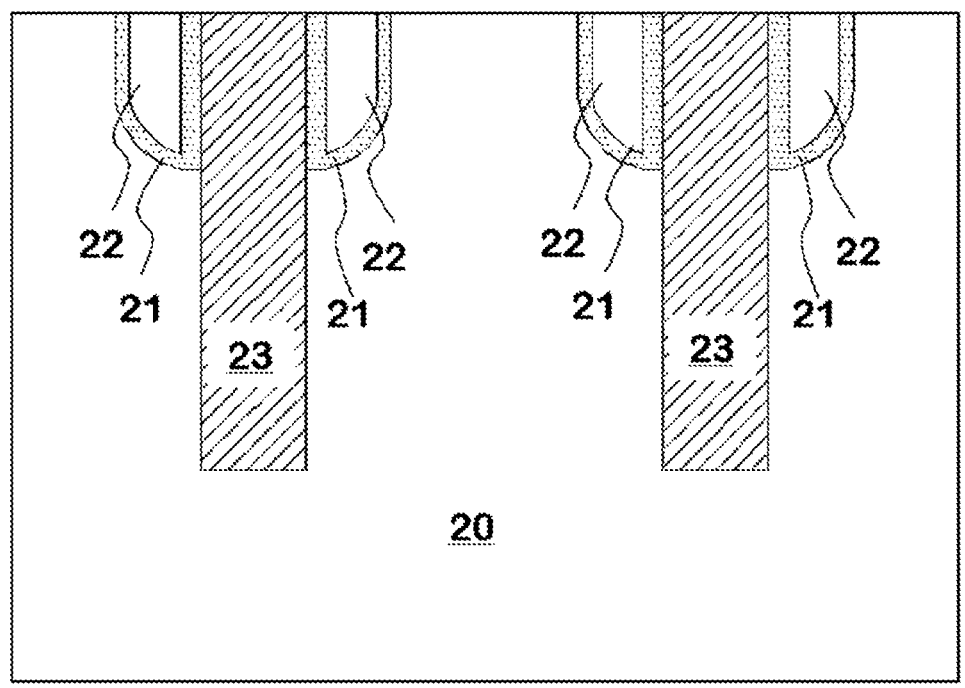

Next, as shown in FIG. 10, a gate dielectric layer 21 and a gate 22 are formed in the gate region of the first trench, and the gate 22 is isolated from the p-type column 23 by the gate dielectric layer 21.

Figure 11:
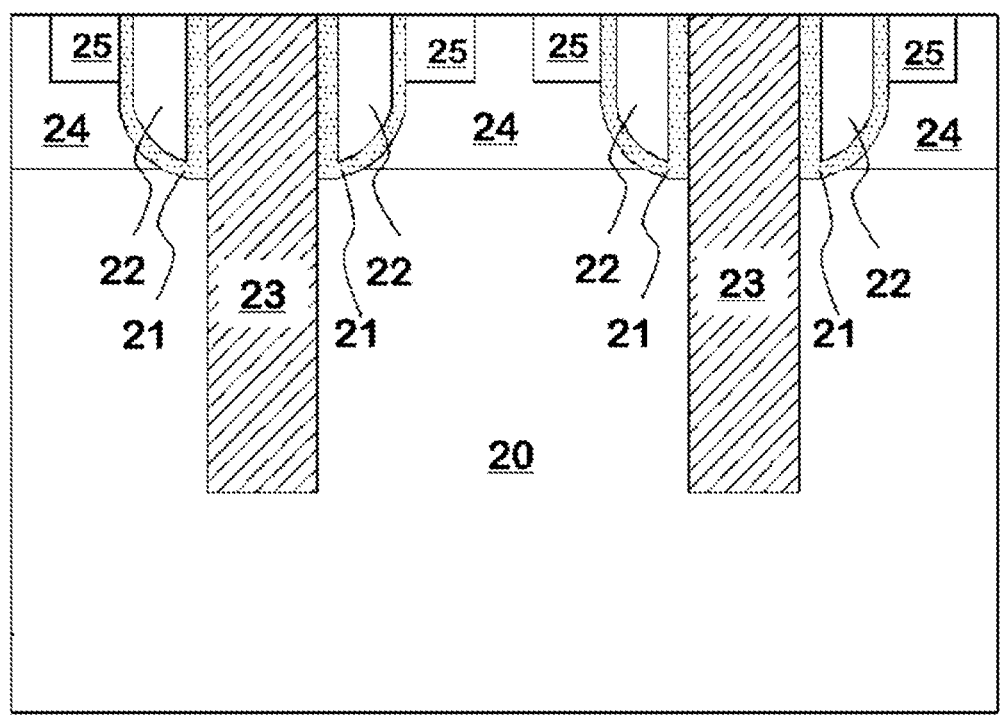

Next, as shown in FIG. 11, a p-type body region 24 is formed in the n-type epitaxial layer 20, and an n-type source region 25 is formed in the p-type body region 24.

Structures such as an interlayer dielectric layer, a metal layer are formed according to a conventional process so as to obtain the semiconductor super-junction device.

What is claimed is:

1. A method for manufacturing a semiconductor super-junction device, comprising:
    forming a hard mask layer on an n-type epitaxial layer, defining a position of a p-type column through a lithography process, etching the hard mask layer, and forming at least one opening in the hard mask layer, wherein the at least one opening corresponds to the position of the p-type column;
    etching the n-type epitaxial layer with the hard mask layer as a mask, and forming a first trench in the n-type epitaxial layer, wherein a width of the first trench is larger than a width of one opening of the at least one opening corresponding to the first trench, and the first trench comprises a p-type column region located below the opening corresponding to the first trench and a gate region located on two sides of the p-type column region;
    forming a sacrificial dielectric layer in the gate region of the first trench;
    etching the n-type epitaxial layer with the hard mask layer and the sacrificial dielectric layer as a mask, and forming a second trench in the n-type epitaxial layer, wherein the second trench is located below the p-type column region corresponding to the second trench;
    forming the p-type column in the p-type column region and the second trench, and forming a pn junction structure between the p-type column and the n-type epitaxial layer; and
    removing the hard mask layer and the sacrificial dielectric layer, and forming a gate dielectric layer and a gate in the gate region of the first trench.

2. The method for manufacturing a semiconductor super-junction device of claim 1, further comprising:

forming a p-type body region in the n-type epitaxial layer; and forming an n-type source region in the p-type body region.

3. The method for manufacturing a semiconductor super-junction device of claim 1, wherein the hard mask layer is a laminated layer of a silicon oxide layer, a silicon nitride layer, and a silicon oxide layer.

4. The method for manufacturing a semiconductor super-junction device of claim 1, wherein an etching method combining an anisotropic etching and an isotropic etching is adopted during forming the first trench through an etching.

5. The method for manufacturing a semiconductor super-junction device of claim 1, wherein the sacrificial dielectric layer is made of a silicon oxide.

6. The method for manufacturing a semiconductor super-junction device of claim 1, wherein a width of the second trench is greater than a width of the p-type column region corresponding to the second trench.

7. The method for manufacturing a semiconductor super-junction device of claim 6, wherein an etching method combining an anisotropic etching and an isotropic etching is adopted during forming the second trench through an etching.

8. The method for manufacturing a semiconductor super-junction device of claim 1, wherein before forming the p-type column, the method further comprises:

performing a p-type ion implantation once to form a p-type compensation region below the second trench or to form a p-type compensation region in the n-type epitaxial layer below the second trench and on two sides of the second trench.

9. The method for manufacturing a semiconductor super-junction device of claim 1, wherein the p-type column is made of a p-type polycrystalline silicon.

* * * * *